United States Patent
Tamboli et al.

(10) Patent No.: US 9,328,318 B2
(45) Date of Patent: May 3, 2016

(54) METHOD FOR WAFER DICING AND COMPOSITION USEFUL THEREOF

(71) Applicants: Dnyanesh Chandrakant Tamboli, Breinigsville, PA (US); Rajkumar Ramamurthi, Cave Creek, AZ (US); David Barry Rennie, Bethlehem, PA (US); Madhukar Bhaskara Rao, Fogelsville, PA (US); Gautam Banerjee, Latham, NY (US); Gene Everad Parris, Coopersburg, PA (US)

(72) Inventors: Dnyanesh Chandrakant Tamboli, Breinigsville, PA (US); Rajkumar Ramamurthi, Cave Creek, AZ (US); David Barry Rennie, Bethlehem, PA (US); Madhukar Bhaskara Rao, Fogelsville, PA (US); Gautam Banerjee, Latham, NY (US); Gene Everad Parris, Coopersburg, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 32 days.

(21) Appl. No.: 14/195,285

(22) Filed: Mar. 3, 2014

(65) Prior Publication Data
US 2014/0170835 A1  Jun. 19, 2014

Related U.S. Application Data

(63) Continuation of application No. 13/171,252, filed on Jun. 28, 2011, now Pat. No. 8,883,701.

(60) Provisional application No. 61/362,896, filed on Jul. 9, 2010.

(51) Int. Cl.
*H01L 21/02* (2006.01)
*C11D 3/20* (2006.01)
(Continued)

(52) U.S. Cl.
CPC ............ *C11D 3/2082* (2013.01); *B28D 5/0076* (2013.01); *C11D 3/044* (2013.01);
(Continued)

(58) Field of Classification Search
CPC .... C11D 11/0047; C11D 3/2082; C11D 3/33; C11D 3/044; C11D 3/2075; C11D 3/30; C11D 1/14; C11D 1/22; C11D 1/29; C11D 1/72; B28D 5/0076; H01L 21/67075; H01L 21/78
USPC ......... 510/245, 254, 255, 258, 259, 264, 477, 510/488, 504; 438/460
See application file for complete search history.

(56) References Cited

U.S. PATENT DOCUMENTS 5,461,008 A   10/1995   Sutherland et al.
5,466,389 A   11/1995   Ilardi et al.
(Continued)

FOREIGN PATENT DOCUMENTS

CN   1271000 A   10/2000
CN   1405287 A   3/2003
(Continued)

OTHER PUBLICATIONS

"Keteca Diamaflow Dicing Solutions & Surfactants"; http://www.ketecadicing.com/diamaflow.htm, Nov. 2009.
(Continued)

*Primary Examiner* — Gregory R Delcotto
(74) *Attorney, Agent, or Firm* — Lina Yang

(57) ABSTRACT

A solution for semiconductor wafer dicing is disclosed. The solution suppresses the adherence of contamination residues or particles, and reduces or eliminates the corrosion of the exposed metallization areas, during the process of dicing a wafer by sawing. The solution comprises at least one organic acid and/or salt thereof; at least a surfactant and/or at least a base; and deionized water, the composition has a pH is equal or greater than 4. The solution can further comprise, a chelating agent, a defoaming agent, or a dispersing agent.

11 Claims, 9 Drawing Sheets

(51) Int. Cl.

| | |
|---|---|
| B28D 5/00 | (2006.01) |
| C11D 3/04 | (2006.01) |
| C11D 3/30 | (2006.01) |
| C11D 3/33 | (2006.01) |
| C11D 11/00 | (2006.01) |
| H01L 21/67 | (2006.01) |
| C11D 1/14 | (2006.01) |
| H01L 21/78 | (2006.01) |

(52) U.S. Cl.
CPC .............. *C11D 3/2075* (2013.01); *C11D 3/30* (2013.01); *C11D 3/33* (2013.01); *C11D 11/0047* (2013.01); *H01L 21/67075* (2013.01); *C11D 1/14* (2013.01); *H01L 21/02076* (2013.01); *H01L 21/78* (2013.01); *H01L 2224/0381* (2013.01); *H01L 2224/04042* (2013.01); *H01L 2224/05624* (2013.01); *H01L 2224/05647* (2013.01); *H01L 2224/94* (2013.01)

(56) References Cited

U.S. PATENT DOCUMENTS

| | | | |
|---|---|---|---|
| 6,383,991 B1 | 5/2002 | Hashimoto et al. | |
| 6,555,477 B1 | 4/2003 | Lu et al. | |
| 6,673,754 B1 | 1/2004 | Nabeshima et al. | |
| 6,730,644 B1 | 5/2004 | Ishikawa et al. | |
| 7,188,630 B2 | 3/2007 | Flake et al. | |
| 7,541,322 B2 | 6/2009 | Ikemoto et al. | |
| 8,765,653 B2 * | 7/2014 | Tamboli et al. | 510/175 |
| 2003/0096500 A1 | 5/2003 | Kneer | |
| 2004/0035354 A1 | 2/2004 | Kneer | |
| 2004/0209443 A1 | 10/2004 | Cadieux et al. | |
| 2005/0009714 A1 | 1/2005 | Chen et al. | |
| 2005/0056810 A1 | 3/2005 | Bian et al. | |
| 2005/0176606 A1 | 8/2005 | Konno et al. | |
| 2005/0205835 A1 | 9/2005 | Tamboli et al. | |
| 2005/0250660 A1 | 11/2005 | Takashima | |
| 2006/0073997 A1 | 4/2006 | Leonte et al. | |
| 2006/0270573 A1 | 11/2006 | Ikemoto et al. | |
| 2007/0010406 A1 | 1/2007 | Okamoto et al. | |
| 2007/0075041 A1 | 4/2007 | Ishibashi et al. | |
| 2007/0099807 A1 | 5/2007 | Smith et al. | |
| 2007/0135322 A1 | 6/2007 | Morinaga et al. | |
| 2008/0045016 A1 | 2/2008 | Andou et al. | |
| 2008/0173328 A1 | 7/2008 | Nishiwaki | |
| 2008/0261847 A1 | 10/2008 | Visintin et al. | |
| 2009/0001315 A1 | 1/2009 | Ishikawa | |
| 2009/0056744 A1 | 3/2009 | Carswell | |
| 2009/0120457 A1 | 5/2009 | Naghshineh et al. | |
| 2010/0009517 A1 | 1/2010 | Collier et al. | |
| 2011/0136717 A1 | 6/2011 | Tamboli et al. | |

FOREIGN PATENT DOCUMENTS

| | | |
|---|---|---|
| CN | 1918698 A | 2/2007 |
| CN | 101085541 A | 12/2007 |
| CN | 101205498 A | 6/2008 |
| EP | 1 577 934 A1 | 9/2005 |
| EP | 1 715 510 A1 | 10/2006 |
| EP | 1808480 | 10/2009 |
| JP | 55-4980 A | 1/1980 |
| JP | 60-38871 82 | 9/1985 |
| JP | 07-297158 | 11/1995 |
| JP | 2000031770 A2 | 1/2000 |
| JP | 2005-179630 A | 7/2005 |
| JP | 2009-013301 A | 1/2009 |
| KR | 2006-0127098 | 12/2006 |
| KR | 2008-0023662 A | 3/2008 |
| TW | 200617622 A | 6/2006 |
| TW | 1262552 | 9/2006 |
| TW | 1297730 | 6/2008 |
| TW | 201005819 A | 2/2010 |
| WO | 02/065538 A2 | 8/2002 |
| WO | 2007037628 | 5/2007 |

OTHER PUBLICATIONS

Duan, S., et al.; "Al Pad Corrosion Mechanism Study when Dicing Saw"; Proceedings of the 33rd Int'l Symposium or Testing and Failure Analysis; Nov. 4-8, 2007; McEnery Convention Center, San Jose, CA; pp. 121-125.

Younan, H., et al.; "Studies of Silicon Dust Corrosion on Microchip Al Bondpads and Elimination of Silicon Dust During Wafer Sawing Process"; Proceedings of the 32nd Int'l Symposium for Testing and Failure Analysis; Nov. 12-16, 2006; Penaissance Austin Hotel, Austin, TX; pp. 300-304.

Hua, Y.N., et al.; "Failure Analysis and Elimination of Galvanic Corrosion on Bondpads During Wafer Sawing"; Proceeding from the 26th International Symposium for Testing and Failure Analysis; Nov. 12-16, 2000; Bellevue, Washington; pp. 369-372.

\* cited by examiner

METHOD FOR WAFER DICING AND COMPOSITION USEFUL THEREOF

CROSS-REFERENCE TO RELATED APPLICATIONS

This application is a continuation application filed under 35 U.S.C. §1.53(b) and claims the benefit of priority under 35 U.S.C. §120 to earlier filed U.S. non-provisional patent application Ser. No. 13/171,252, filed on Jun. 28, 2011, now U.S. Pat. No. 8,883,701, which claims the benefit of priority under 35 U.S.C. §119(e) to earlier filed U.S. provisional patent application Ser. No. 61/362,896, filed on Jul. 9, 2010, the disclosures of which are incorporated herein by reference.

BACKGROUND OF THE INVENTION

The integrated circuits are usually formed on a wafer. A single wafer contains plurality of integrated circuit chips, or dies. An integrated circuit chip or dice, is obtained through a dicing process of sawing the wafer.

During the dicing process, small contaminant residues/particles from sawing the wafer, usually silicon residue, adhere to wafer surface, accumulate in bonding pads and trenched locations. They are difficult to remove in subsequent cleaning processes once in contact with wafer and virtually impossible to remove once trapped in deep trenches. In addition, during the dicing process, the bonding pads are exposed for corrosion to occur. Corrosion can damage the bonding pads leading to poor bonding performance, poor reliability, or even failure of the device. The contaminant particles and corrosion can cause problems at later assembly operation such as wirebonding.

One approach to reducing corrosion during dicing, involves the use of high purity deionized water (DIW) as a coolant for the dicing blade. The cutting area and the rotating blade are ordinarily bathed in a significant flow of deionized water. One also would think that the silicon residue would be flushed away by the water coolant that floods the cutting area. Unfortunately, even under significant flooding, the small silicon particles are not completely flushed away. Worse, the water coolant can lead to a build up of static charge, resulting in accumulation of silicon residues/particles on the bonding pads, as well as contributing to corrosion.

As the semiconductor technology rapidly advances, wafer size is increased, while die size is reduced. This prolongs the time spent for dicing, which leads to more challenges.

BRIEF SUMMARY OF THE INVENTION

It is therefore an objective of the present invention to provide a dicing solution or a solution for semiconductor wafer dicing, and a method to use the solution, that is effective in inhibiting adherence of the contamination residues/particles to all exposed surface areas and the corrosion of all exposed surface areas.

One embodiment of the present invention provides a solution for semiconductor wafer dicing inhibiting adherence of contamination residues and corrosion of the exposed metallization areas, comprising:
  at least one first compound selected from the group consisting of an organic acid and salt thereof;
  at least one second compound selected from the group consisting of a surfactant and a base;
  the remainder being substantially deionized water; and
  the solution has a pH greater than 4.

Another embodiment of the present invention provides a method for wafer dicing, the wafer is diced by a saw with bonding pads, contamination residues are produced by sawing the wafer, corrosion is potentially formed on all exposed metallization areas; comprising steps of:
  contacting the wafer with a solution during the dicing, the solution comprising
    at least one first compound selected from the group consisting of an organic acid and salt thereof;
    at least one second compound selected from the group consisting of a surfactant and a base; and
    the remainder being substantially deionized water; and
    the solution has a pH greater than 4.

More specifically, the at least one first compound is from 0.001 wt % to 30 wt %; the surfactant is from 0.001 wt % to 10 wt %; and the base is from 0.001 wt % to 20 wt %; wherein the solution is diluted with deionized water from 1:0 to 1:10000.

The solution can further comprise chelating agents, defoaming agents or dispersing agents.

Yet another embodiment of the present invention provides a solution for semiconductor wafer dicing inhibiting adherence of contamination residues and corrosion of the exposed metallization areas, comprising:
  from 0.001 wt % to 30 wt % of at least one acid selected from the group consisting of citric acid and oxalic acid;
  the at least one compound selected from the group consisting of from 0.001 wt % to 20 wt % of a base and from 0.001 wt % to 10 wt % of a surfactant;
  the remainder being substantially deionized water;
  the solution has a pH greater than 4 and less than 13; and
  the solution is diluted with deionized water from 1:0 to 1:10000;
  wherein
  the base is selected from the group consisting of potassium hydroxide (KOH) and tetramethylammonium hydroxide (TMAH); and
  the surfactant is selected from the group consisting of secondary alcohol ethoxylate and secondary alkanesulfonate.

BRIEF DESCRIPTION OF SEVERAL VIEWS OF THE DRAWINGS

FIG. 3(*b*) shows the average Kerf size (mm) for dicing solution 38A versus DI water on ceramic.

FIG. 3(*c*) shows the average Kerf size (mm) for dicing solution 38A versus DI water on silicon wafers.

FIG. 4(*b*) shows the average chips and burrs size for dicing solution 38A versus DI water on ceramic.

FIG. 4(*c*) shows the average chips and burrs size for dicing solution 38A versus DI water on silicon wafers.

DETAILED DESCRIPTION OF THE INVENTION

Conductivity and Resistivity

Figure 1:
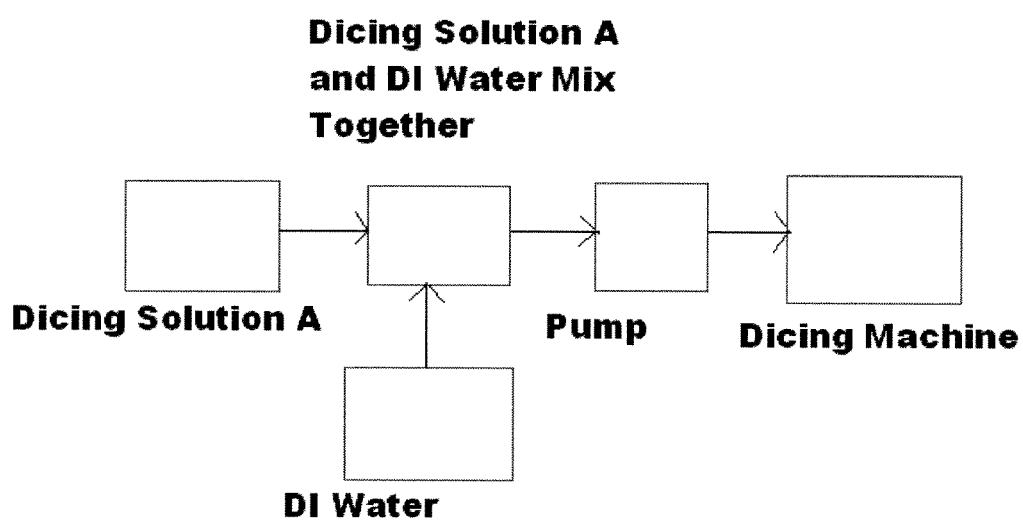
FIG. 1 is a schematic drawing of a typical apparatus for wafer dicing by sawing.

During the dicing process electrostatic charge can accumulate on the wafer.

This charge build-up and/or a subsequent electrostatic discharge (ESD) can damage sensitive devices on the wafers. Electrostatic charge can also attract particles to the wafer surface. Therefore it is important to dissipate any electrostatic charge build-up during the dicing process. One method for dissipating the electrostatic charge is by using a dicing fluid that has a low resistivity (high conductivity). The conducting fluid provides a path for the charge to dissipate during dicing. DI water is commonly used as a dicing fluid in order to provide lubrication between the saw blade and the wafer. DI water also acts as a coolant to prevent the saw blade from overheating due to friction between the saw blade and the wafer. However, DI water has a high resistivity (typically about 18 megaohms) so it is not a good conducting fluid for charge dissipation. A commonly used method to lower the resistivity of the DI water is by injecting $CO_2$ into the DI water. This lowers the resistivity of the DI water so the fluid is better at dissipating charge. The dicing solution disclosed in current invention has a lower resistivity than even $CO_2$ sparged DI water. Therefore this dicing solution will be better at dissipating charge build-up on the wafer during dicing.

Surface Tension and Low Foam

During the dicing process small contaminant residues, usually silicon residue, adhere to the wafer surface and accumulate on Al bond pads and trench areas. These silicon particles can cause issues when the Al bond pads are probed/tested for functionality. The silicon particles can also cause poor adhesion during wirebonding when another metal is being bonded to the Al bond pads. Therefore these Si residues need to be removed from the wafer surface. Usually a dicing solution is used during the dicing process. The dicing solution is a fluid that is sprayed onto the saw blade and the wafer. One function of the dicing solution is to remove the Si residues from the wafer surface. In order to improve the particle removal, the dicing solution often contains a surfactant. This reduces the surface tension of the dicing solution so that it wets the surface of the wafer better. Better wetting of the surface will improve particle removal. Even at high dilutions, the dicing solution disclosed in the current invention has a much lower surface tension than DI water. This means that the dicing solution will have better particle removal capabilities than DI water. The dicing solution disclosed in current invention also has a lower surface tension than several of the commonly used commercial dicing solutions.

Even though a surfactant in the dicing solution will reduce the surface tension to provide better particle removal, there is one potential issue with a surfactant: foaming. Many surfactants will cause foam to occur in the dicing solution. The foam can interfere with the dicing solution's ability to remove particles. The foam itself can dry on the wafer and leave particles of its own. Therefore it is important that as little foam as possible be generated in the dicing solution. In tests on actual dicing machines, The dicing solution disclosed in current invention generated little foam at the point of use of the saw blade and wafer surface in comparison to a competitor product. The dicing solution disclosed in current invention also generated less foam than the commonly used commercial dicing solutions in a recirculation tank.

pH

Al bond pads are often exposed during the dicing process. A dicing solution is often used during dicing for lubrication, cooling, particle removal, etc. Very often DI water is the dicing solution. An issue with using DI water is that its pH is about 7 and at that pH Al corrosion will occur. Typical times of 20-30 minutes can be required to dice a wafer. During that time the Al bond pads will be exposed to DI water which can cause Al corrosion. One method for preventing the Al corrosion in DI water is to inject $CO_2$ into the DI water. This lowers the pH of the DI water to about 4-4.5. At this pH Al corrosion will be minimized. Another method for preventing Al corrosion during dicing is to use a dicing solution that lowers the pH of the DI water. The pH of the dicing solution disclosed in current invention at typical dilutions with DI water from 1:0 to 1:10000 used for dicing is 4 to 13. At this pH the dicing solution will minimize Al corrosion on exposed Al bond pads during dicing. This has been shown in evaluations on actual wafers.

Copper Oxide Removal

When wafers with exposed Cu surfaces (Cu bond pads or other Cu surfaces) reach the dicing process, the Cu surface may have an oxidation and contamination layer on it due to previous process steps. After dicing, the Cu surface may go through a test/probe process to check the part for electrical functionality. During testing a probe tip touches down on the Cu surface. Ideally the contact resistance between the Cu surface and the probe tip should be as low as possible. However, if the Cu surface has a thick oxidation layer and/or a contamination layer on it the contact resistance may be high and cause the probe test to fail even though the part may be a functional part. To prevent these "false fails" from happening, the Cu surface can be cleaned to remove the oxidation and contamination layer so the Cu surface is as clean as possible when the probe tip touches it. Problems due to a thick oxidation and/or contamination layer on a Cu surface can also occur at wirebonding which is when a metal wire is being bonded to the Cu surface. Again, if the Cu surface has a thick oxidation/contamination layer the metal wire may not adhere well to the Cu surface. Therefore a process to clean the Cu surface would be advantageous as well for wirebonding. The dicing solution disclosed in current invention is capable of removing Cu oxide with minimal etching of the underlying Cu surface. Therefore the Cu surface can be cleaned during the dicing process itself if The dicing solution disclosed in current invention is used during dicing.

Thus, the expected dicing solution should have (a)a lower resistivity (high conductivity) to be better at dissipating charge build-up on the wafer during dicing, (b)a lower surface tension for better particle removal capabilities; (c) less foam generated; (d) a pH to minimize Al corrosion on exposed Al bond pads during dicing; and (e) the ability to remove Cu oxide with minimal etching of the underlying Cu surface. The formulations or dicing solutions comprise of (a) Organic acids or salts and mixtures thereof; and (b) a surfactant or a mixture of surfactants, where the pH of the formulation is equal or larger than 4.

Organic acids function to improve trace metal removals, remove organic residues, pH adjustment or reduce corrosion of metals. Organic acids can be chosen from a broad range of acids, including but not limited to: oxalic acid, citric acid, maliec acid, malic acid, malonic acid, gluconic acid, glutaric acid, ascorbic acid, formic acid, acetic acid, ethylene diamine tetraacetic acid, diethylene triamine pentaacetic acid, aminobenzoic acids such as anthranilic acid, fumaric acid, glycine, alanine, cystine etc. Salts of these acids may also be used. A mixtrure of these acids/salts may be used as well.

The formulation or dicing solutions may contain from 0.001 to 30 wt % (by weight) of organic acids/salts. Preferred organic acid concentration range from 0.01 to 5 wt %. A combination of organic acids and salts may also be used to buffer the solution at the desired level.

Surfactants are used in this formulation to improve wetting of the surfaces (blade and the wafer surface) during dicing. This would help in improving lubrication properties, helping extend the blade life and reducing the kerf loss. Surfactants would also remove particles and residues from the surface, without redepositing on the surfaces.

The choice of the surfactant may depend upon various criteria, including; wetting properties, foaming properties, detergency, rinsability, etc. A surfactant which has very low surface tension at low concentrations and has low foaming properties is highly desirable for this application. A combination of surfactants may also be used, wherein one surfactant is used to solubilize a less soluble hydrophobic surfactant molecule. Optional solvosurfactant molecules can be used to increase solubility of difficult to dissolve surfactants, such as acetylenic diol surfactants.

Various types of surfactants, such as anionic, cationic, non-ionic, zwitterionic surfactants or combinations thereof may be used.

Examples of surfactants include but not limited to: silicone surfactants, poly(alkylene oxide) surfactants, and fluorochemical surfactants. Suitable non-ionic surfactants for use in the process composition include, but are not limited to: acetylenic alcohol type surfactants, such as Surfynol S-61; octyl and nonyl phenol ethoxylates, such as: TRITON® X-114, X-102, X-100, X-45, and X-15; and alcohol ethoxylates, such as: BRIJ® 56 (C16H33(OCH2CH2)100H) (ICI), BRIJ® 58 (C16H33(OCH2CH2)200H) (ICI), and secondary alcohol ethoxylates, such as Tergitol 15-S-7. Anionic surfactants may include linear alkylbenzenesulfonates (LAS), secondary alylbenzenesulfonate, fatty alcohol sulfates (FAS), secondary alkanesulfonates (SAS), such as Hostapur SAS; and in some cases also fatty alcohol ether sulfates (FAES).

Still further exemplary surfactants include: acetylenic diol type of surfactants, such as Dynol® 604, primary alcohol ethoxylates, phenyl ethoxylates, amine ethoxylates, glucosides, glucamides, polyethylene glycols, poly(ethylene glycol-co-propylene glycol); or other surfactants provided in the reference: McCutcheon's Emulsifiers and Detergents, North American Edition for the Year 2000 published by Manufacturers Confectioners Publishing Co. of Glen Rock, N.J.

The formulation or dicing solutions may contain surfactant having concentration ranging from 0.001 to 10 wt % or preferably from 0.01 to 5 wt %. Preferred surfactants for this application are secondary alcohol ethoxylates, specific example being Tergitol 15-S-7 from Dow Chemicals; secondary alkanesulfonates (SAS), such as Hostapur SAS; acetylenic alcohol, such as Surfynol S-61; and octyl and nonyl phenol ethoxylates, such as TRITON® X series.

The formulation or dicing solutions can further comprise a base to further control the pH of the formulation to the desired level (equal or >4). The pH of the cleaning solution may range greater than 4 and less than 13.

The base may be selected from a range of chemicals, including but not limited to: potassium hydroxide(KOH), guanidiene carbonate, aqueous ammonia, ammonium hydroxides and quaternary ammonium hydroxides. The organic bases may be used either alone or in combination with one another.

Specific examples of quaternary ammonium salts include: tetramethylammonium hydroxide (TMAH), tetraethylammonium hydroxide, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide and (1-hydroxypropyl)trimethylammonium hydroxide.

The formulation or dicing solutions may contain bases having concentration ranging from 0.001 to 20 wt %.

The formulation or dicing solutions may contain chelating agents. The chelating agents may be selected from, but not limited to aminobenzoic acids such as anthranilic acid, ethylenediaminetetracetic acid (EDTA), N-hydroxyethylethylenediaminetriacetic acid (NHEDTA), nitrilotriacetic acid (NTA), diethylklenetriaminepentaceticdiethylenetriamine pentaacetic acid (DPTA), ethanoldiglycinate, citric acid, gluconic acid, oxalic acid, phosphoric acid, tartaric acid, methyldiphosphonic acid, am inotrismethylenephosphonic acid, ethylidene-diphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid and 1,2-propanediaminetetamethylenephosphonic acid or ammonium salts, organic amine salts, maronic acid, succinic acid, dimercapto succinic acid, glutaric acid, maleic acid, phthalic acid, fumaric acid, polycarboxylic acids such as tricarbaryl acid, propane-1,1,2,3-tetracarboxylic acid, butane-1,2,3,4- tetracarboxylic acid, pyromellitic acid, oxycarboxylic acids such as glycolic acid, β-hydroxypropionic acid, citric acid, malic acid, tartaric acid, pyruvic acid, diglycol acid, salicylic acid, gallic acid, polyphenols such as catechol, pyrogallol, phosphoric acids such as pyrophosphoric acid, polyphosphoric acid, heterocyclic compounds such as 8-oxyquinoline, ethylene glycol, glycerol and diketones such as α-dipyridyl acetylacetone.

The formulation or dicing solutions may contain chelating agents having concentration ranging from 0.001 wt % to 10 wt %.

The formulation or dicing solutions may contain defoaming agents. The defoaming agents may selected from, but not limited to silicones, organic phosphates, EO/PO based defoamers containing polyethylene glycol and polypropylene glycol copolymers, alcohols, white oils or vegetable oils and the waxes are long chain fatty alcohol, fatty acid soaps or esters.

The formulations may contain defoaming agents having concentration ranging from 0.001 wt % to 5 wt %.

The formulation or dicing solutions may contain dispersing agents. The dispersing agents may selected from, but not limited to anionic dispersing agents, nonionic dispersing agents, cationic dispersing agents, and ampholytic dispersing agents; and a polymeric dispersing agent containing an acrylic acid salt as a copolymerized component.

Examples of the water-soluble anionic dispersing agents include triethanolamine laurylsulfate, ammonium laurylsulfate, polyoxyethylene alkyl ether triethanolamine sulfate, and especial polycarboxylic acid type polymeric dispersing agents. Examples of the water-soluble nonionic dispersing agents include polyoxyethylene lauryl ether, polyoxyethylene cetyl ether, polyoxyethylene steary ether, polyoxyethylene oleyl ether, polyoxyethylene higher alcohol ether, polyoxyethylene octyl phenyl ether, polyoxyethylene nonyl phenyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hardened castor oil, and alkylalkanolamide.

Examples of the water-soluble cationic dispersing agents include polyvinylpyrrolidone, coconutamine acetate, and stearylamine acetate. Examples of the water-soluble ampholytic dispersing agents include laurylbetaine, stearylbetaine, lauryldimethylamine oxide, and 2-alkyl-N-carboxymethyl-N-hydroxyethylimidazolinium betaine.

The formulations may contain dispersing agents having concentration ranging from 0.001 wt % to 5 wt %.

In a dicing application, the formulation can then be diluted with de-ionized water at dilutions of anywhere from 1:0 to 1:10000 at the process tool for convenience. The mixture is pumped into a dicing machine which cuts wafers into individual die. The dicing machine has spray nozzles that spray the mixture onto the surface of the wafer.

The mixture is dispensed at room temperature (typically about 25° C.). The mixture then drains off the wafer surface and either goes down the drain or is recirculated through a filter and re-sprayed back onto the wafer surface. A simple schematic of the set-up is shown in FIG. 1.

FIG. 1 shows a typical apparatus for wafer dicing by sawing employed in the present invention. A NANOACE Saw tool with diamond-tip wheel at 60000 RPM, and a test saw recipe x/y dicing at about 30 minutes/wafer, are used, the feed rate is about 5mm/s. The diluted dicing solution is injected from a nozzle at flow rate about 0.22 lit/minute. Temperature of DI Water and dicing solution on wafer surface is room Temperature (20° C. to 30° C.). Dicing solution is injected continuously during sawing.

Wafers are scrubbed with sponge and DIW after sawing. They are then rinsed with DIW and spin dried with Clean Dry Air (CDA) in a spin rinse module.

The wafer can be cleaned (pre-treatment) with a cleaning solution prior to saw. One example of the cleaning solution comprises N,N-dimethyl acetamide (DMAC), Ammonium Acetate, Acetic acid (glacial), Ammonia Fluoride ($NH_4F$) and the remainder being substantially deionized water.

WORKING EXAMPLES

Group I

A dicing solution 38A comprising water (95.28 wt %), citric acid (2 wt %), potassium hydroxide(KOH)(0.72 wt %), and Tergitol 15-S-7 (2 wt %) was made.

A dicing solution 38B comprising water (>90 wt %), Hostapur SAS (1 wt %), Dynol 604 (0.5 wt %), citric acids (2 wt %) and potassium hydroxide (KOH) (<7.5 wt %) to adjust pH to 6 was made similarly as for the dicing solution 38A.

A dicing solution 38C comprising water (>90 wt %), Triton X-100 (2 wt %), Citric acid (2 wt %), and potassium hydroxide (KOH) (<6 wt %) to adjust pH to 6 was made similarly as for the dicing solution 38A.

A dicing solution 38D comprising water (>90 wt %), ethylene diaminetetraacetic acid (2 wt %), Tergitol 15-S-7 (2 wt %), and tetraethylammonium hydroxide(<6 wt %) to adjust pH to 7 was made similarly as for the dicing solution 38A.

A dicing solution 38E comprising water (>90 wt %), glycine (2 wt %), and Tergitol 15-S-7 (2 wt %) was made similarly as for the dicing solution 38A.

The above formulations or the dicing solutions were then diluted with de-ionized water at dilutions of anywhere from 1:0 to 1:10000 at the process tool for convenience.

A dicing solution 58A comprising 2.0 wt % citric acid in de-ionized water was prepared as follows: to a one liter HDPE poly-bottle was added 69.0 gm of 29 wt % citric acid solution. 18.7 gm of a 10.04 wt % Hostapur SAS surfactant solution was added to the bottle. A total of 908.9 gm of de-ionized water was added to the bottle. For pH adjustment 3.4 gm of 48 wt % KOH solution was added for a final weight of 1000.0 gm. The bottle was capped and shaken. The dicing solution pH was measured to be 2.66. The dicing solution was then diluted with deionized water at 1:1000. The pH, conductivity, resistivity, and surface tension of dicing solution 58A undiluted and diluted was shown in Table I.

A dicing solution 58B comprising 2.0 wt % oxalic acid and 0.5 wt % citric acid in de-ionized water was prepared as follows: to a one liter HDPE poly-bottle was added 243.3 gm of an aqueous solution containing 8.2 wt % oxalic acid in water. To the same one liter HDPE poly-bottle was added 17.2 gm of 29 wt % citric acid solution. 18.7 gm of a 10.04 wt % Hostapur SAS solution was added to the bottle. A total of 694.0 gm of de-ionized water was added to the bottle. For pH adjustment 26.8 gm of 48 wt % KOH solution was added for a final weight of 1000.0 gm. The bottle was capped and shaken. The dicing solution pH was measured to be 2.54. The dicing solution was then diluted with deionized water at 1:1000. The pH, conductivity, resistivity, and surface tension of dicing solution 58B undiluted and diluted was shown in Table I.

A dicing solution 58C comprising 2.0 wt % citric acid in de-ionized water was prepared as follows: to a one liter HDPE poly-bottle was added 69.0 gm of 29 wt % citric acid solution. 10.0 gm of a pure Tergitol 15-S-7 surfactant was added to the bottle. A total of 918.0 gm of de-ionized water was added to the bottle. For pH adjustment 3.0 gm of 48 wt % KOH solution was added for a final weight of 1000.0 gm. The bottle was capped and shaken. The dicing solution pH was measured to be 2.52. The dicing solution was then diluted with deionized water at 1:1000. The pH, conductivity, resistivity, and surface tension of dicing solution 58C undiluted and diluted was shown in Table I.

A dicing solution 59C comprising 2 wt % citric acid, 0.72 wt % KOH, 1 wt % Tergitol 15-S-7 and 96.86 wt % water was made as for 58C, but the pH was adjusted to 3.96. The dicing solution was diluted with deionized water at 1:1000. The pH, conductivity, resistivity, and surface tension of dicing solution 58C undiluted and diluted was shown in Table I.

TABLE I

Dicing Solutions

| Dicing Solutions | Dilution | pH | Conductivity (uS/cm) | Resistivity (M-cm) | Surface Tension (dynes/cm) |
|---|---|---|---|---|---|
| DI Water | None | 7 | 0.71 | 1.41 | 73 |
| 38A | Undiluted | 5.71 | 23529 | 0.000042 | 31.2 |
| 38A | 1:50 | 6.46 | 769 | 0.0013 | 31.3 |
|  | 1:100 | 6.54 | 367 | 0.0027 | 31.4 |
|  | 1:250 | 6.58 | 169 | 0.0059 | 31.8 |
|  | 1:500 | 6.58 | 77.2 | 0.013 | 32.6 |
|  | 1:1000 | 6.48 | 39.6 | 0.025 | 34.7 |
| 58A | Undiluted | 2.66 | 3710 | 0.00027 | 31.6 |
|  | 1:1000 | 4.09 | 39.7 | 0.025 | 75.1 |
| 58B | Undiluted | 2.54 | 21500 | 0.000047 | 29.0 |
|  | 1:1000 | 3.97 | 72.8 | 0.014 | 74.9 |
| 58C | Undiluted | 2.52 | 3100 | 0.00032 | 31.5 |
|  | 1:1000 | 3.93 | 38.9 | 0.026 | 42.1 |

TABLE I-continued

Dicing Solutions

| Dicing Solutions | Dilution | pH | Conductivity (uS/cm) | Resistivity (M-cm) | Surface Tension (dynes/cm) |
|---|---|---|---|---|---|
| 59C | Undiluted | 3.96 | 10490 | 0.000095 | Not Determined |
|  | 1:1000 | 4.56 | 24.58 | 0.041 | 44.9 |
| 60C | Undiluted | 4.65 | 15180 | 0.000066 | 30.8 |
|  | 1:1000 | 5.13 | 26.34 | 0.038 | 44.1 |

A dicing solution 60C comprising 2 wt % citric acid, 1.04 wt % KOH, 1 wt % Tergitol 15-S-7 and 95.96 wt % water was made as for 58C, but the pH was adjusted to 4.65. The dicing solution was then diluted with deionized water at 1:1000. The pH, conductivity, resistivity, and surface tension of dicing solution 60C undiluted and diluted were shown in Table I.

The pH, conductivity(μS/cm), resistivity (MΩ-cm), surface tension (dynes/cm) of the dicing solutions undiluted and diluted with DI water at various ratios were shown in Table I. The DI water was also shown in Table I as a reference.

Table I showed the pH of the dicing solutions at typical dilutions used for dicing was 4 to 6.5. At this pH the dicing solutions would minimize Al corrosion on exposed Al bond pads during dicing.

As stated before, the method for dissipating the electrostatic charge in the present invention was using a dicing solution having a low resistivity (high conductivity).

The conducting dicing solution provides a path for the charge to dissipate during dicing. Since dicing solution 38A has a low resistivity and high conductivity, thus it was better at dissipating charge build-up on the wafer during dicing.

Furthermore, during the dicing process, a dicing solution with lower surface tension wets the surface of the wafer better. Better wetting of the surface will improve particle removal.

The surface tension of most dicing solutions diluted with DI water at various ratios were shown in Table I. In comparison with DI water which was 73 dynes/cm at 20° C., data in Table I indicated that most dicing solutions had better particle removal capabilities than DI water.

Group II

The following experiments had been carried out using beakers with stir bars to simulate the dicing process.

Dicing Solution 38A, 58A, 58B, 58C, 59C and 60C were diluted from 1:50 to 1:1000 and tested for CuOx removal. The experiments were performed in two groups. Group one was for dicing solution 38A, and Group two was for the rest dicing solutions. All test data was shown in Table II.

Dicing Solution 38A

The Wafers tested in this experiment were blanket wafers with Cu/Thermal Oxide/Si. The wafer immersion in the beaker was set up to last 20 minutes.

The Cu oxide removal tests were conducted as follows. A beaker of dicing solution 38A was stirred with a magnetic stir bar. A piece of a Cu wafer was held with plastic forceps and immersed into the dicing solution 38A. The temperature of dicing solution 38A was maintained at 25° C. After 20 minutes of immersion in dicing solution 38A, the Cu wafer segment was removed from dicing solution 38A and rinsed with DI water for 30 seconds. Then the Cu wafer piece was dried by blowing the DI water off with $N_2$.

The Ellipsometry tests were carried out to measure the Cu oxide thickness using model on ellipsometer. Data were shown in Table II. The initial thickness of Cu oxide was about 175 Å

In the tests, Cu oxide thickness was measured on each wafer prior to immersion and after immersion in dicing solution 38A.

Etch rate for the undiluted dicing solution 38A could not be determined since the Cu oxide was completely removed. It is not known if the Cu oxide was removed in the first 5 minutes or if it took all 20 minutes to remove it. At a minimum the Cu oxide etch rate for the concentrated dicing solution 38A was at least 175 Å/20 min=8.75 Å/min, but it is very possible the etch rate was higher than this.

The DI water alone or with the cleaning solution for the pre-treatment was not effective to prevent the surface oxidation and the silicon residues/particles adhesion to the Cu wafer surface. While the dicing solution 38A used during wafer dicing by sawing, inhibited the formation of oxide layer, prevented adhesion of the silicon residues/particles to the Cu wafer surface, and was capable of removing Cu oxide with minimal etching of the underlying Cu surface, as shown in Table II. Therefore the Cu surface can be cleaned during the dicing process itself if dicing solution 38A was used during dicing.

Typical times of 20-30 minutes can be required to dice a wafer. During that time the Al bond pads will be exposed which can cause Al corrosion.

By measuring the galvanic current density of the dicing solution, it can be determined whether or not that dicing solution will cause Al corrosion. If the galvanic current density is close to zero then no galvanic corrosion is predicted.

Figure 2:
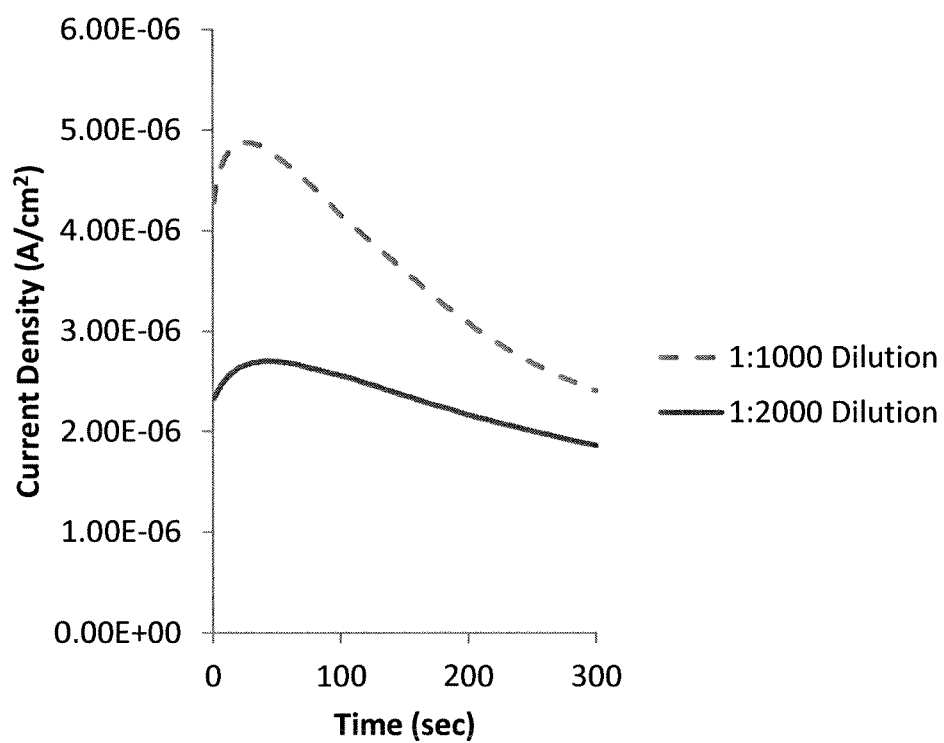
FIG. 2 (*a*) and (*b*) show the galvanic current density for dicing solution 38A versus tap water.
Figure 2:
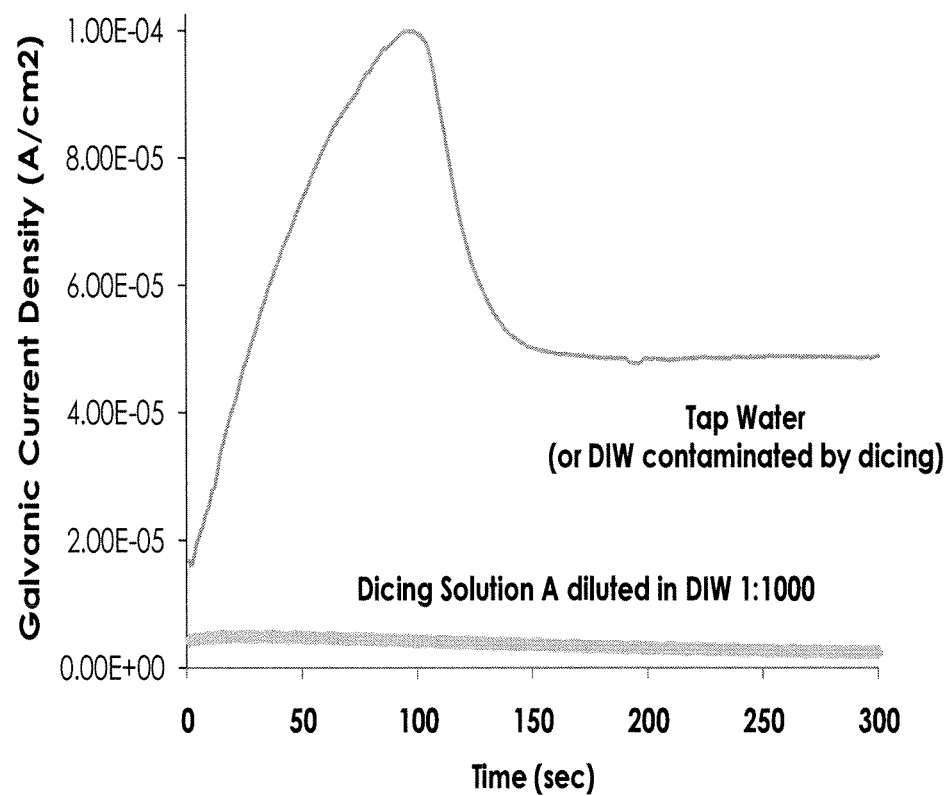

Shown in FIG. 2 was the galvanic current density for dicing solution 38A versus tap water (similar to DI water that was contaminated with particles from the dicing process). Al and Cu films were coupled and immersed in each dicing solution and their galvanic current densities measured. Al and Cu were coupled together because the Al bond pads were composed of an alloy of Al (0.5% Cu). The current density for dicing solution 38A was close to zero and was much less than the current density for tap water.

This indicated that dicing solution 38A would not cause galvanic corrosion during the dicing process. This is important because the Al surface should be as corrosion-free as possible after dicing to enable a better wirebonding process.

When a dicing blade cuts through a wafer or other substrate the word used to define the path where the blade went is called the kerf. In theory, the kerf should be the same width as the blade. But if the blade is not properly cooled and lubricated and particles were not removed from the blade's path, then the kerf can become wider than the blade width. This is undesirable since areas of the wafer or substrate that should not be cut were actually cut. Therefore, a good quality dicing process will have the kerf width as small as possible (as close to the blade width as possible).

Figure 3:
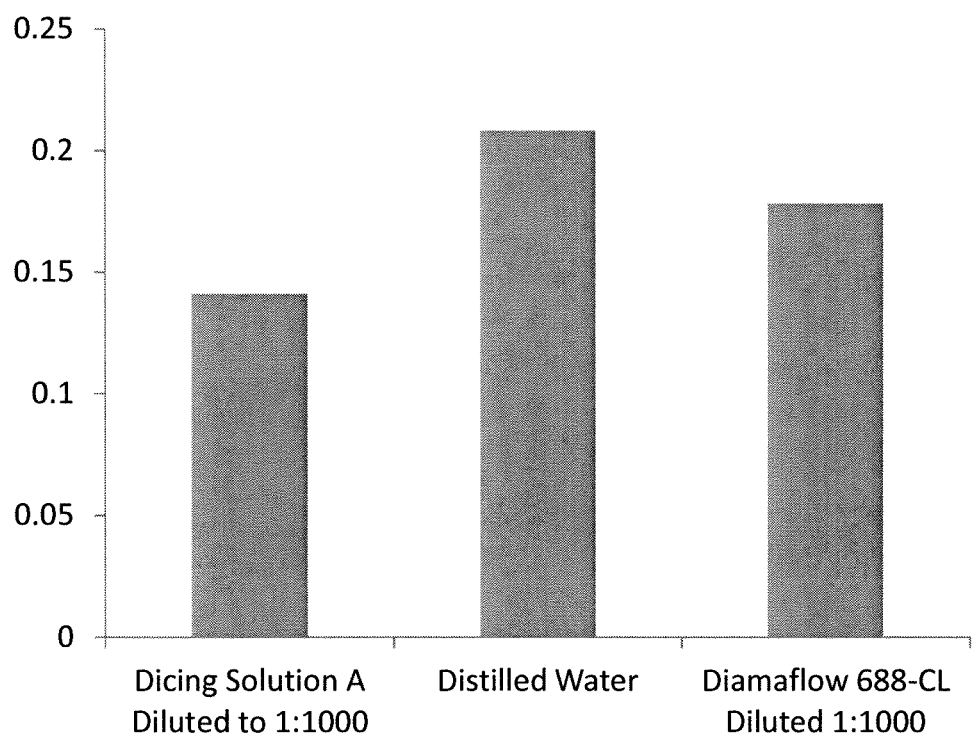
FIG. 3(*a*) shows the average Kerf size (mm) for dicing solution 38A versus DI water on Ball Grid Array (BGA).
Figure 3:
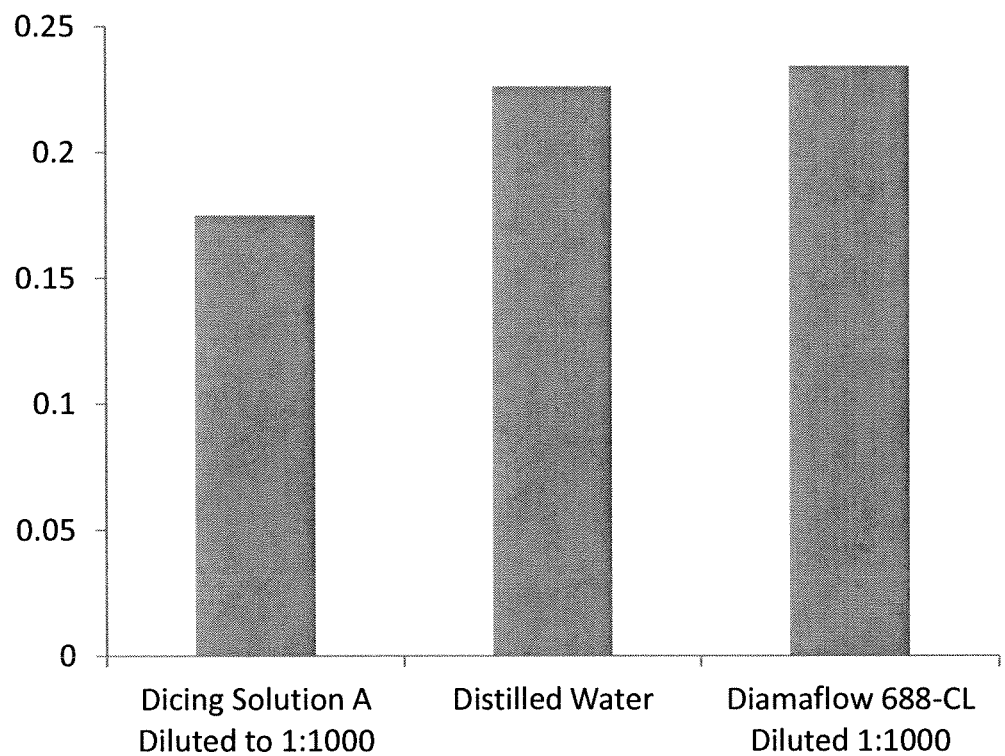
Figure 3:
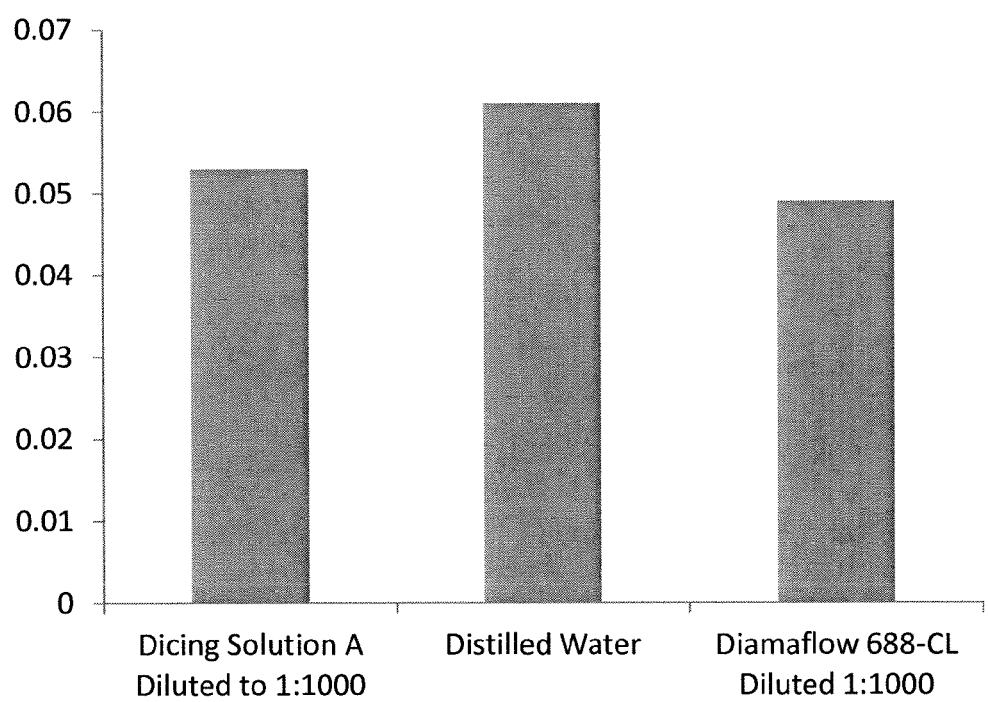

The data in FIG. 3(a) to FIG. 3(c) showed that on all 3 types of substrates tested, Ball Grid Array (BGA), ceramic, and silicon wafers, the dicing solution 38A had a lower average kerf width than DI water commonly used dicing solution. On BGA and ceramic substrates the dicing solution 38A had a smaller average kerf width than a commonly used commercial dicing solution.

When a dicing blade cuts through a wafer or other substrate there can be chips and burrs along the kerf. Chips were small pieces of the substrate that broke off during the dicing process. Burrs typically happen with when cutting through metals—burrs were where the metal does not cut cleanly and smears along the kerf. Both of these (chips/burrs) were undesirable. A good dicing process has very few chips and burrs along the kerf—the edge of the kerf should be smooth. Also, the smaller the average size of the chips and burrs the better.

Figure 4:
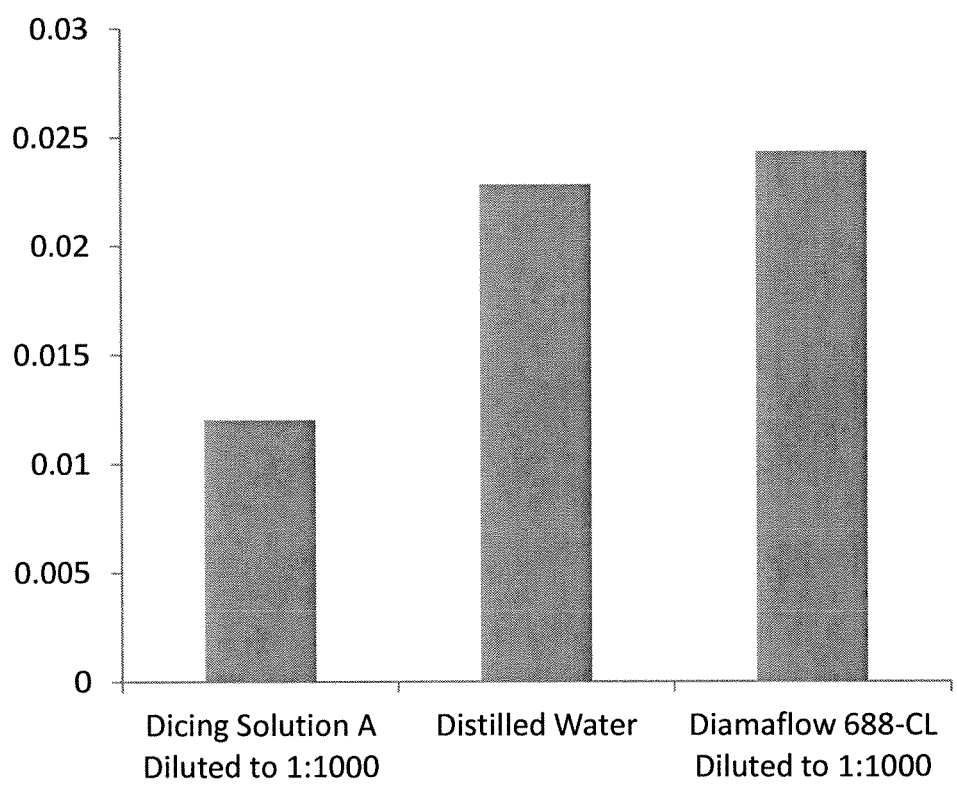
FIG. 4(*a*) shows the average chips and burrs size for dicing solution 38A versus DI water on Ball Grid Array (BGA).
Figure 4:
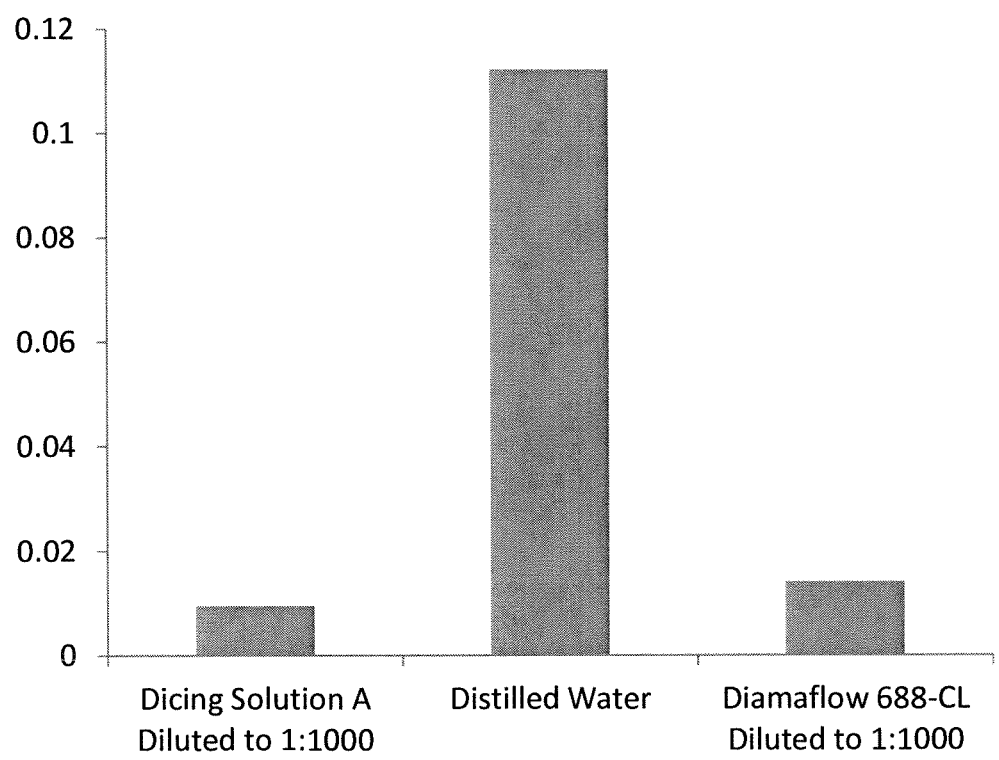
Figure 4:
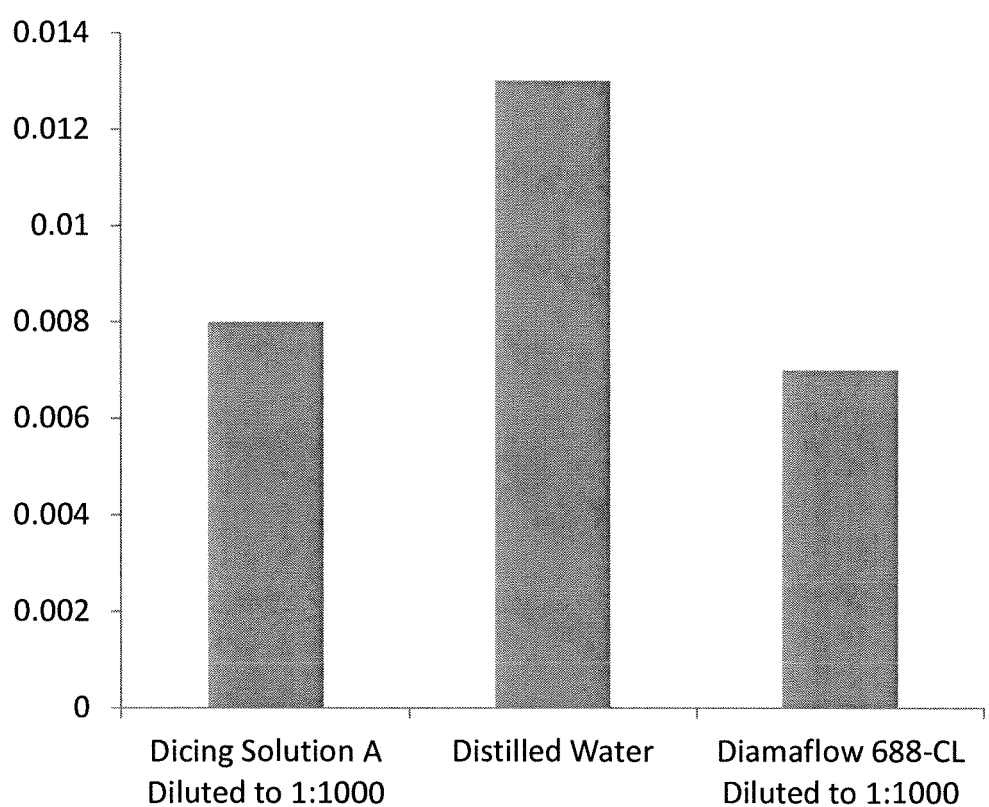

The data in FIG. 4(a) to FIG. 4(c) indicated that on all 3 types of substrates tested (BGA, ceramic, and silicon wafers) the dicing solution 38A had a smaller average chip/burr size than DI water commonly used dicing solution. On BGA and ceramic substrates the dicing solution 38A had a smaller average chip/burr size than a commonly used commercial dicing solution.

Dicing Solutions 58A, 58B, 58C, 59C and 60C

For dicing solutions 58A, 58B, 58C, 59C and 60C, the Cu oxide etch rates were high. Cu oxide etch rates were determined from linear regression of thicknesses measured at 1, 3, 5, 10 and 30 min intervals where applicable, this was indicated as "a" in Table II.

TABLE II

Cu Oxide Removal

| Dicing Solutions | Dilution | Initial Cu Oxide Thickness (Å) | Cu Oxide Thickness Post-Cleaning (Å) | Cu Oxide Removed in 20 min (Å) | Cu Oxide Etch Rate (Å/min) |
|---|---|---|---|---|---|
| 38A | Undiluted | 174 | 0 | 174 | Not Determined |
|  | 1:50 | 175 | 118 | 57 | 2.85 |
|  | 1:100 | 170 | 129 | 41 | 2.05 |
|  | 1:250 | 176 | 136 | 40 | 2.00 |
|  | 1:500 | 169 | 138 | 31 | 1.55 |
|  | 1:1000 | 177 | 152 | 25 | 1.25 |
| 58A | 1:1000 | 138 | 0 | $a$ | 9.4 |
| 58B | 1:1000 | 140 | 0 | $a$ | 23.5 |
| 58C | 1:1000 | 141 | 0 | $a$ | 8.8 |
| 59C | 1:1000 | 149 | $a$ | $a$ | 4.9 |
| 60C | 1:1000 | 146 | $a$ | $a$ | 3.9 |

[a]Determined from linear regression of thicknesses measured at 1, 3, 5, 10 and 30 min intervals where applicable.

Group III

A. Undiluted Dicing solutions

Example 3

Al(0.5% Cu) metal on titanium nitride (TiN) substrate with a resistivity of 338.24 ohms-Å/Sq was obtained from SVMI and had nominally 8000 Å thickness of Al. During storage the Al substrate can grow up to 150 Å of an oxide layer. Prior to etch rate determinations the Al substrate was therefore pretreated by immersing a 2"×2" piece of
Al into an aqueous solution of 42.5 wt % $H_3PO_4$ in de-ionized water for 2 minutes at 25° C. After immersing for 2 minutes, the Al piece was rinsed for 3 minutes with de-ionized water, dried with a $N_2$ gun for 30 seconds, and the Al film thickness was then measured. Al pieces pretreated in this way were used immediately in etch rate measurements performed.

Example 4

A dicing solution comprising 2.0 wt % oxalic acid in de-ionized water was prepared as follows: To a one liter HDPE poly-bottle was added 224.2 gm of an aqueous solution containing 8.92 wt % oxalic acid. An additional 775.8 gm of de-ionized water was then added to the bottle to a final weight of 1000.0 gm. The bottle was capped and shaken. The dicing solution was named 48A and the solution pH was measured to be 1.04.

Dicing solution 48A was submitted for etch rate measurements at 25° C. using a pretreated piece of Al, as well as using 1000 Å Ni on thermal oxide (TOx) substrates. The Ni substrate had a resistivity of 2035.64 ohm-Å/Sq. Each 2"×2" piece of Al or Ni substrate was immersed into 330 ml of the 48A dicing solution in a 500 ml glass beaker and the solution stirred on a stir plate at 300 rpm. The temperature was recorded. Thickness measurements in Å were made in triplicate after times 0, 20, 40, 60, and 90 minutes using a ResMap Four Point probe. The film thickness versus time data was then regressed. An etch rate was determined for Al and Ni separately to be 0.6 Å/min and 3.3 Å/min, respectively.

TABLE III

Etch rates for Undiluted Oxalic Acid Solutions at 25° C.

| EXAMPLE | Dicing Solutions | pH | Oxalic Acid (wt %) | TMAH[b] (wt %) | Etch Rate (Å/min) Al | Etch Rate (Å/min) Ni |
|---|---|---|---|---|---|---|
| 4 | 48A | 1.04 | 2.0 | 0 | 0.6 | 3.3 |
| 5 | 50B | 1.32 | 1.0 | 0 | 3.8 | 6.2 |
| 6 | 50E | 1.46 | 0.67 | 0 | 4.4 | 10.6 |
| 7 | 49A | 3.30 | 2.0 | 8.7 | 1.5 | 18.9 |
| 8 | 55A | 4.47 | 2.0 | 14.8 | 2.1 | 15.5 |
| 9 | 55B | 5.45 | 2.0 | 16.1 | 1.7 | 1.4 |

[b]As 25 wt % aqueous solution.

Examples 5-9

Additional dicing solutions 50B, 50E, 49A, 55A, and 55B were prepared as for 48A but with varying oxalic acid concentrations and/or final pH in Examples 5-9, respectively. The etch rate results were summarized in Table III. Etch rates for Al and Ni metals both went through a maximum versus pH.

Example 10

A dicing solution comprising 2.0 wt % citric acid in de-ionized water was prepared as follows: To a one liter HDPE poly-bottle was added 6.9 gm of an aqueous solution containing 29 wt % citric acid. An additional 993.1 gm of de-ionized water was then added to the bottle to a final weight of 1000.0 gm. The bottle was capped and shaken. The dicing solution was named 48B and the solution pH was measured to be 1.93.

Dicing solution 48B was submitted for etch rate measurements using a pretreated piece of Al and 1000 Å Ni on TOx substrates, as in Example 4. The film thickness versus time data was then regressed. An etch rate was determined for Al and
Ni separately to be <1 Å/min for both substrates. The ResMap Four Point Probe was able to measure changes in film thickness that were >20 Å, so an etch rate of <1 Å/min indicated that there was insufficient etch of the film over a 30-90 minute test.

TABLE IV

Etch rates for Undiluted Citric Acid Solutions at 25° C.

| EXAMPLE | Dicing Solutions | pH | Citric Acid (wt %) | TMAH[c] (wt %) | Etch Rate (Å/min) Al | Ni |
|---|---|---|---|---|---|---|
| 10 | 48B | 1.93 | 2.0 | 0 | <1 | <1 |
| 11 | 49B | 3.43 | 2.0 | 3.5 | 0.5 | <1 |
| 12 | 55E | 4.38 | 2.0 | 6.3 | <1 | <1 |
| 13 | 55F | 5.34 | 2.0 | 9.2 | <1 | <1 |

[c]As 25 wt % aqueous solution.

Examples 11-13

Additional dicing solutions 49B, 55E, and 55F were prepared as for 48B but with varying citric acid concentrations and/or final pH in Examples 11-13, respectively. The amount of TMAH and the final etch rate results were summarized in Table IV. Etch rates for Al and Ni metals were <1 Å/min for all pH values up to 5.3.

Example 14

A dicing solution comprising 2.0 wt % fumaric acid in de-ionized water was prepared as follows: To a one liter HDPE poly-bottle was added 2.0 gm of solid fumaric acid. An additional 998.0 gm of de-ionized water was then added to the bottle to a final weight of 1000.0 gm. The bottle was capped and shaken. An undetermined amount of fumaric acid crystals remained un-dissolved. The supernatant solution was collected and the dicing solution was named 48C. The solution pH was measured to be 2.13.

Dicing solution 48C was submitted for etch rate measurements using a pretreated piece of Al and 1000 Å Ni on TOx substrates, as in Example 4. The film thickness versus time data was then regressed. An etch rate was determined for Al and Ni separately to be <1 Å/min for both substrates.

TABLE V

Etch rates for Undiluted Fumaric Acid Solutions at 25° C.

| EXAMPLE | Dicing Solutions | pH | Fumaric Acid (wt %) | TMAH[d] (wt %) | Etch Rate (Å/min) Al | Ni |
|---|---|---|---|---|---|---|
| 14 | 48C | 2.13 | <2.0 | 0 | <1 | <1 |
| 15 | 49C | 3.3 | 2.0 | 3.3 | 0.7 | <1 |
| 16 | 55G | 4.27 | 2.0 | 9.98 | 0.4 | <1 |
| 17 | 55H | 5.13 | 2.0 | 11.65 | 0.4 | <1 |

[d]As 25 wt % aqueous solution

Examples 15-17

Additional dicing solutions 49C, 55G, and 55H were prepared as for 48C but with varying fumaric acid concentrations and/or final pH in Examples 15-17, respectively. The amount of TMAH and the final etch rate results were summarized in Table V. Etch rates for Al and Ni metals were <1 Å/min for all pH values up to 5.1.

Example 18

A dicing solution comprising 2.0 wt % oxalic acid and 0.2 wt % fumaric acid in de-ionized water was prepared as follows: to a one liter HDPE poly-bottle was added 224.4 gm of an aqueous solution containing 8.92 wt % oxalic acid. To the same one liter HDPE poly-bottle was added 2.0 gm of solid fumaric acid. A total of 679.4 gm of de-ionized water was added to the bottle. For pH adjustment 94.2 gm of 25 wt % TMAH solution was added for a final weight of 1000.0 gm. The bottle was capped and shaken. The dicing solution was named 53B and the solution pH was measured to be 3.44. An etch rate was determined for Al and Ni separately to be 0.6 Å/min and 1.4 Å/min, respectively. Table VI also showed the result for Comparative Example 7 and illustrated that addition of 0.2 wt % fumaric acid to a 2.0 wt % oxalic acid solution at pH=3.3-3.5 reduced the Ni metal etch rate by more than one-order of magnitude.

Examples 19-20

Additional dicing solutions 53E and 53F were prepared as for 53B but with varying fumaric acid concentrations and/or final pH. For pH adjustment, a 25 wt % TMAH mixture was used. The amount of fumaric acid and TMAH, as well as the final etch rate results were summarized in Table VI. Etch rates for Al were essentially unchanged. Ni metal etch rates were also significantly reduced as seen for Examples 20 and 21, however, the Ni etch rate increased with increasing fumaric acid.

Example 21

A dicing solution comprising 2.0 wt % oxalic acid and 0.5 wt % citric acid in de-ionized water was prepared as follows: to a one liter HDPE poly-bottle was added 243.92 gm of an aqueous solution containing 8.2 wt % oxalic acid. To the same one liter HDPE poly-bottle was added 17.24 gm of 29 wt% citric acid solution. A total of 625.92 gm of de-ionized water was added to the bottle. For pH adjustment 112.92 gm of 25 wt % TMAH solution was added for a final weight of 1000.0 gm. The bottle was capped and shaken. The dicing solution was named 56H and the solution pH was measured to be 3.48. An etch rate was determined for Al and Ni separately to be 0.6 Å/min and 0.5 Å/min, respectively. This result was summarized in Table VI and illustrated that addition of 0.5 wt % citric acid to a 2.0 wt % oxalic acid solution at pH=3.3-3.5 reduced the Ni metal etch rate by more than one-order of magnitude.

TABLE VI

Etch rates for Undiluted Oxalic, Fumaric, and Citric Acid Solutions at 25° C.

| EXAMPLE | Dicing solution | pH | Weight % Oxalic Acid | | TMAH[e] | Etch Rate (Å/min) Al | Ni |
|---|---|---|---|---|---|---|---|
| | | | | Fumaric Acid | | | |
| 7 | 49A | 3.30 | 2.0 | 0 | 8.7 | 1.5 | 18.9 |
| 18 | 53B | 3.44 | 2.0 | 0.2 | 9.4 | 0.6 | 1.4 |
| 19 | 53E | 3.46 | 2.0 | 0.5 | 9.7 | 1.2 | 3.8 |
| 20 | 53F | 3.5 | 2.0 | 1.0 | 11.2 | 1.8 | 7.7 |
| | | | | Citric Acid | | | |
| 21 | 56H | 3.48 | 2.0 | 0.5 | 11.3 | 0.6 | 0.5 |

[e]As 25 wt % aqueous solution

Example 22

An etch rate was determined for dicing solution 58A on Al and Ni separately to be <1 Å/min for both metals. This result illustrated that KOH could be used to replace TMAH and was consistent with the results found for Examples 10 to 13.

Example 23

An etch rate was determined for dicing solution 58B on Al and Ni separately to be <1 Å/min for both metals. When compared with the data in Table III for pH adjusted oxalic acid solutions, the results again showed the significant reduction in Ni etch rate. This result further illustrated that KOH could be used to replace TMAH in the mixed oxalic and citric acid dicing solutions, and was consistent with the results found for Example 22 at a pH of 3.48.

Example 24

An etch rate was determined for dicing solution 58C on Al and Ni separately to be <1 Å/min for both metals. This result illustrates that Tergitol surfactant could be used in place of Hostapur SAS surfactant in Example 22 without significant change to etch rates.

Example 25

A dicing solution comprising 2.0 wt % oxalic acid and 0.5 wt % citric acid in de-ionized water was prepared as follows: to a one liter HDPE poly-bottle was added 243.3 gm of an aqueous solution containing 8.2 wt % oxalic acid. To the same one liter HDPE poly-bottle was added 17.2 gm of 29 wt % citric acid solution. 10.0 gm of a pure Tergitol 15-S-7 surfactant was added to the bottle. A total of 703.6 gm of de-ionized water was added to the bottle. For pH adjustment 25.9 gm of 48 wt % KOH solution was added for a final weight of 1000.0 gm. The bottle was capped and shaken. The dicing solution was named 58E and the solution pH was measured to be 2.42. An etch rate was determined for Al and Ni separately to be <1 Å/min for both metals. This result illustrated that Tergitol surfactant could be used in place of HOSTAPUR SAS surfactant in Example 23 without significant change to etch rates.

Examples 26-31

A series of additional dicing solutions were made with varying composition and pH. Dicing solutions 59A and 60A comprised citric acid and HOSTAPUR SAS as for 58A in Group I; dicing solutions 59B and 60B comprised oxalic acid plus citric acid and HOSTAPUR SAS as for 58B in Group I; and dicing solutions 59D and 60D comprised oxalic acid plus citric acid and Tergitol 15-S-7 in Example 25.

The series of dicing solutions named 59A, 59B, and 59D were all pH adjusted with KOH to the range of pH =3.9-4.2. When diluted with de-ionized water at 1:1000 these 59-series dicing solutions gave a point-of-use pH of approximately 4.5 as for 59C in Group I. Similarly, the series of dicing solutions named 60A, 60B, and 60D were all pH adjusted with KOH to the range of pH=4.5-4.7. When diluted with de-ionized water at 1:1000 these 60-series dicing solutions gave a point-of-use pH of approximately 5.0 as for 60C in Group I. Dicing solution acidic components, surfactant composition and pH of the undiluted neat oxalic and citric acid dicing solutions were summarized for Examples 26-31 in Table VII.

TABLE VII

Etch rates for Neat Oxalic and Citric Acid Dicing solutions at 25° C.

| EXAMPLE | Dicing solution | pH | Oxalic Acid | Citric Acid | KOH[f] | Surfactant |
|---|---|---|---|---|---|---|
| 26 | 59A | 4.20 | 0 | 2.0 | 1.6 | 0.188 wt % SAS10 |
| 27 | 59B | 4.01 | 2.0 | 0.5 | 4.6 | 0.187 wt % SAS10 |
| 28 | 59D | 3.93 | 2.0 | 0.5 | 4.53 | 1.0 wt % Tergitol |
| 29 | 60A | 4.66 | 0 | 2.0 | 2.2 | 0.188 wt % SAS10 |
| 30 | 60B | 4.57 | 2.0 | 0.5 | 5.4 | 0.188 wt % SAS10 |
| 31 | 60D | 4.50 | 2.0 | 0.5 | 5.26 | 1.0 wt % Tergitol |

[f]As 48 wt % aqueous solution.

B. Diluted Dicing solutions

Example 32

1.0 gm of dicing solution 58A was added to a one liter HDPE poly-bottle. An additional 1000 gm of de-ionized water was added to the bottle. The bottle was capped and shaken. The pH of the resulting 1:1000 dilution was measured to be 4.09. The sample was submitted for etch rate determination on Al, Ni, and Cu metal substrates and CuOx on Cu substrate. The etch rate results were shown in Table VIII.

Examples 33-43

Additional dicing solutions were diluted using similar 1:1000 dilutions. These dilutions were shown in Examples 33-43, Table VIII. The pH value of each of the diluted solutions was measured, and etch rate determinations made for each of the samples at 25° C. on Al, Ni, and Cu metals, as well as Cu oxide (CuOx) on Cu oxide substrate. The results were presented in Table VIII.

TABLE VIII pH and Etch Rates at 25° C.

| Example | Dicing solution at 1:1000 Dilution | pH | Etch Rates (Å/Min) | | | |
|---|---|---|---|---|---|---|
| | | | Al | Ni | Cu | CuOx on Cu |
| 32 | 58A | 4.09 | 0.4 | <1 | 0.8 | 9.4 |
| 33 | 58B | 3.97 | 0.6 | <1 | 0.9 | 23.5 |
| 34 | 58C | 4.19 | 0.4 | <1 | 0.9 | 8.8 |
| 35 | 58E | 3.99 | 0.7 | <1 | 1.0 | 17.4 |
| 36 | 59A | 4.63 | 0.3 | <1 | 0.8 | 4.2 |
| 37 | 59B | 4.33 | 0.7 | <1 | 1.2 | 3.8 |
| 38 | 59C | 4.56 | 0.3 | <1 | 0.9 | 4.9 |
| 39 | 59D | 4.65 | 0.8 | <1 | 1.3 | 4.8 |
| 40 | 60A | 5.10 | 1.4 | <1 | 0.9 | 3.8 |
| 41 | 60B | 5.06 | 1.3 | <1 | 5.7 | <1 |
| 42 | 60C | 5.13 | 0.4 | <1 | 1.0 | 3.9 |
| 43 | 60D | 5.15 | 1.3 | <1 | 5.0 | <1 |

Comparative Example 44

In addition, samples of 1:1000 dilutions of 58E, 59D, and 60D were tested for Al and Ni etch rates at 45° C. and 65° C. Etch rate results were shown in Table IX below and compared with those already presented in Table 6 above for the respective dicing solutions. Since these 3 dicing solutions all contain oxalic and citric acids, as well as Tergitol surfactant, differences in etch rates were due essentially to pH and temperature differences. The results showed that the higher pH of ~5.0 was key to maintain a low Ni etch rate at elevated temperatures.

TABLE IX pH and Etch Rates at 25° C., 45° C., and 65° C. for 1:1000 Diluted Dicing solutions.

| Dicing solution at 1:1000 Dilution | pH | Al etch rate (Å/min) | | | Ni etch rate (Å/min) | | |
|---|---|---|---|---|---|---|---|
| | | 25° C. | 45° C. | 65° C. | 25° C. | 45° C. | 65° C. |
| 58E | 3.99 | 0.7 | 2.9 | 15.2 | <1 | 13.3 | 16.9 |
| 59D | 4.65 | 0.8 | 2.4 | 14.5 | <1 | <1 | 2.8 |
| 60D | 5.15 | 1.3 | 4.7 | 19.7 | <1 | <1 | <1 |

Comparative Example 45

Samples of dicing solutions 60B, 60C, and 60DH were prepared as 1 gallon quantities. The 60DH sample contained one-half the concentration of the 60D dicing solution. It was therefore diluted at 1:500 in order to achieve a side-by-side comparison of results with other dicing solutions that were diluted at 1:1000. The dicing solutions were tested at 1:1000 equivalent dilution in online tests using a DNS wafer dicing saw operation. The dicing tests were intended to determine the life or length of time that dicing blades could be used before any breakage in the blade tip was experienced. Dicing blades were from DISCO and labeled "disco*NBC-ZH 2050*27HEDF". They comprised an Aluminum metal hub with a Ni tip. The Ni tip contained embedded diamonds. All dicing solutions were tested at the following identical dicing conditions: blade RPM: 30000; blade feed rate: 5mm/sec; cut depth into the Si wafer: 50%. In addition, a small portion of each dicing solution was used in etch rate tests for Ni and Cu metals, and CuOx on Cu substrate.

The results for blade life were shown in Table X below. The results indicated that the 3 dicing solutions gave approximately the same blade life at pH of ~5.0. The 60C dicing solution additionally had a beneficially higher CuOx etch rate. A dicing solution with high CuOx etch rate and low Cu metal etch rate ensured good cleaning without damaging of Cu bond pads.

TABLE X

Blade Life and Etch Rates for Diluted Dicing Solutions

| Dicing solution at 1:1000 Dilution | Blade Life (Hrs) | Etch Rates at 1:1000 (Å/min) | | |
|---|---|---|---|---|
| | | Cu (25° C.) | CuOx (25° C.) | Ni (65° C.) |
| 60B | >16 | 4.8 | 0.3 | <1 |
| 60C | ~20 | 1.1 | 8.7 | <1 |
| 60DH[g] | ~19 | 5.1 | 0.4 | <1 |

[g]For 60B and 60C the dicing solutions were diluted 1:1000. For 60DH the dicing solution was diluted 1:500.

Comparative Example 46

Results were presented in Table XI for dicing solutions 58B, 59C, and 60C with pH values after 1:1000 dilution of about 4, 4.5, and 5. The data showed that blade life increases significantly with increasing pH. Based on these blade life results, dicing solutions 48A and 48B in Tables IV and V were expected to have short blade life. Results presented previously in Table VIII also showed, however, that the CuOx etch rate also decreased with increasing pH. The pH of about 5.0 appeared to be the value that optimally afforded low Ni etch rate leading to long blade life and moderate CuOx etch rate for cleaning of Cu bond pads.

TABLE XI

Effect of Dicing Solution pH on Blade Life at 1:1000 Dilution.

| Dicing solution Diluted at 1:1000 | pH | Blade Life (hrs) |
|---|---|---|
| 58B | ~4.0 | 4.05 |
| 59C | ~4.5 | 8-10 |
| 60C | ~5.0 | 20 |

Comparative Example 47

Dicing solutions contained more components. The compositions in Table XII were formulated at a pH of about 4.0. 62A contained 2 wt % oxalic acid while 62B contained 2.0 wt % oxalic acid and 0.5 wt % citric acid. The control dicing solutions 62A and 62B did not contain an additional component (additive) and were pH adjusted to about 4.0 using KOH. Additives were present at typically 0.5 wt % concentration, however, Glutaric and Succinic acids were present at 0.34 wt % and 0.31 wt % to be about equimolar with 0.5 wt % citric acid. None of the dicing solutions contained HOSTAPUR SAS or Tergitol surfactant. The results showed that in these undiluted dicing solutions containing additives could cause a reduction in Ni metal etch rate at 25° C. Of these additives, anthranilic acid appeared to be the most effective in reducing the Ni etch rate.

TABLE XII

Ni Etch Rates at 25° C. for Oxalic-Citric-Additive Dicing solutions

| Undiluted Dicing Solution | pH | Acid Mix | Additive | Ni Etch rate (Å/min) at 25° C. |
|---|---|---|---|---|
| 62A | 4.05 | Oxalic | — | 8.1 |
| 62C | 4.02 | Oxalic | Glutaric | 5.9 |
| 62D | 4.06 | Oxalic | Succinic | 5.5 |
| 63A | 4.02 | Oxalic | Glycine | 2.9 |
| 64A | 3.96 | Oxalic | Surfynol S-61 | 4.1 |
| 65A | 4.0 | Oxalic | Anthranilic acid | 0.3-1.2 |
| 62B | 3.98 | Oxalic + Citric | — | 2.0 |
| 63B | 3.92 | Oxalic + Citric | Glycine | 1.0 |
| 64B | 4.01 | Oxalic + Citric | Surfynol S-61 | 0.3 |
| 65B | 4.09 | Oxalic + Citric | Anthranilic acid | <1 |

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. An apparatus for wafer dicing comprising:
a wafer comprising plurality of integrated circuits;
a dicing machine comprising a dicing saw and a plurality of bond pads;
a dicing solution, comprising:
from 0.001 wt % to 30 wt % of at least one acid selected from the group consisting of citric acid, fumaric acid and oxalic acid;
from 0.001 wt % to 20 wt % of a base;
from 0.001 wt % to 10 wt % of a surfactant;
optionally, at least one of
from 1 ppb to 10 wt % of a chelating agent;
from 1 ppb to 5 wt % of a defoaming agent;
from 1 ppb to 5 wt % of a dispersing agent;
the remainder being deionized water; and
the solution has a pH ranging from 4 to 6.58;
wherein
the base is potassium hydroxide (KOH); and
the surfactant is selected from the group consisting of secondary alcohol ethoxylate, secondary alkanesulfonate, and mixtures thereof;
deionized water;
and
a mixer containing mixture of the dicing solution and the deionized water; and
the mixture is in contact with the wafer and the dicing saw.

2. A method of wafer dicing, wherein the wafer is diced by a saw with bonding pads, contamination residues are produced by sawing the wafer, corrosion is potentially formed on all exposed metallization areas; comprising steps of:
contacting the wafer with a solution during the dicing, the solution consisting of:
at least one compound selected from the group consisting of an organic acid and salt thereof;
a surfactant which has low surface tension at low concentrations and low foaming;
a base selected from the consisting of potassium hydroxide (KOH), guanidiene carbonate, aqueous ammonia, and ammonium hydroxide;
optionally, at least one of
a chelating agent;
a defoaming agent;
a dispersing agent;
the remainder deionized water; and
the solution has a pH ranging from 4 to 6.58.

3. The method of claim 2, wherein
the at least one first compound ranges from 0.001 wt % to 30 wt %;
the surfactant ranges from 0.001 wt % to 10 wt %;
the base ranges from 0.001 wt % to 20 wt %;
the chelating agent ranges from 1 ppb to 10 wt %;
the defoaming agent ranges from 1 ppb to 5 wt %;
the dispersing agent ranges from 1 ppb to 5 wt %; and
wherein the solution is diluted with deionized water from 1:0 to 1:10000.

4. The method of claim 2, wherein
the organic acid is selected from the group consisting of oxalic acid, citric acid, maliec acid, malic acid, malonic acid, gluconic acid, glutaric acid, ascorbic acid, formic acid, acetic acid, ethylene diamine tetraacetic acid, diethylene triamine pentaacetic acid, aminobenzoic acids such as anthranilic acid, fumaric acid, glycine, alanine, cystine, and mixtures thereof; and
the surfactant is selected from the group consisting of anionic surfactants, cationic surfactants, non-ionic surfactants, zwitterionic surfactants, silicone surfactants, poly(alkylene oxide) surfactants, fluorochemical surfactants, acetylenic diol surfactants, primary alcohol ethoxylates, secondary alcohol ethoxylates, amine ethoxylates, glucosides, glucamides, polyethylene glycols, poly(ethylene glycol-co-propylene glycol), and combinations thereof.

5. The method of claim 4, wherein
the non-ionic surfactant is selected from the group consisting of octyl and nonyl phenol ethoxylates, secondary alcohol ethoxylates, acetylenic alcohol and combinations thereof;
the anionic surfactant is selected from the group consisting of linear alkylbenzenesulfonates (LAS), secondary alylbenzenesulfonate, fatty alcohol sulfates (FAS), secondary alkanesulfonates (SAS), fatty alcohol ether sulfates (FAES), and combinations thereof.

6. The method of claim 2, wherein the solution consist of
at least one acid selected from the group consisting of citric acid and oxalic acid;
a base of potassium hydroxide (KOH);
at least one surfactant selected from the group consisting of secondary alcohol ethoxylate and secondary alkanesulfonate; and
the remainder being deionized water.

7. The method of claim 2, wherein the chelating agent ranges from 0.001 wt % to 10 wt % and is selected from the group consisting of: aminobenzoic acids; ethylenediaminetetracetic acid (EDTA), N-hydroxyethylethylenediaminetriacetic acid (NHEDTA), nitrilotriacetic acid (NTA), diethylklenetriaminepentaceticdiethylenetriaminepentaacetic acid (DPTA), ethanoldiglycinate, citric acid, gluconic acid, oxalic acid, phosphoric acid, tartaric acid, methyldiphosphonic acid, aminotrismethylenephosphonic acid, ethylidenediphosphonic acid, 1-hydroxyethylidene-1,1-diphosphonic acid, 1-hydroxypropylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexadiaminetetrakismethylenephosphonic acid, diethylenetriaminepentamethylenephosphonic acid, 1,2-propanediaminetetetamethylenephosphonic acid, ammonium salts, organic amine salts, maronic acid, succinic acid, dimercapto succinic acid, glutaric acid, maleic acid, phthalic acid, fumaric acid, polycarboxylic acids, propane-1,1,2,3-tetracarboxylic acid, butane-1,2,3,4- tetracarboxylic acid, pyromellitic acid, oxycarboxylic acid, β-hydroxypropionic acid, citric acid, malic acid, tartaric acid, pyruvic acid, diglycol acid, salicylic acid, gallic acid, polyphenols, pyrogallol, phosphoric acids, polyphosphoric acid, heterocyclic compounds, ethylene glycol, glycerol, diketones, and mixtures thereof.

8. The method of claim 7, wherein
the oxycarboxylic acid is selected from the group consisting of glycolic acid, β-hydroxypropionic acid, citric acid, malic acid, tartaric acid, pyruvic acid, diglycol acid, salicylic acid, gallic acid, and mixtures thereof;
the polyphenol is selected from the group consisting of catechol, pyrogallol, phosphoric acids, pyrophosphoric acid, polyphosphoric acid and mixtures thereof; and
the heterocyclic compound is selected from the group consisting of 8-oxyquinoline, diketones, α-dipyridyl acetylacetone, and mixture thereof.

9. The method of claim 2, wherein the defoaming agent ranges from 0.001 wt % to 5 wt % and is selected from the group consisting of:

silicones, organic phosphates, EO or PO based defoamers containing polyethylene glycol and polypropylene glycol copolymers, alcohols, white oils, vegetable oils, waxes, long chain fatty alcohol, fatty acid soaps, esters and mixtures thereof; and the dispersing agent ranges from 0.001 wt % to 5 wt % and is selected from the group consisting of: water-soluble anionic dispersing agents, water-soluble nonionic dispersing agents, water-soluble cationic dispersing agents, water-soluble ampholytic dispersing agents; a polymeric dispersing agent containing an acrylic acid salt as a copolymerized component, and mixtures thereof.

10. The method of claim 9, wherein the water-soluble anionic dispersing agent is selected from the group consisting of triethanolamine laurylsulfate, ammonium laurylsulfate, polyoxyethylene alkyl ether triethanolamine sulfate, and polycarboxylic acid polymeric dispersing agents; the water-soluble nonionic dispersing agent is selected from the group consisting of polyoxyethylene lauryl ether, polyoxyethylene cetyl ether, polyoxyethylene steary ether, polyoxyethylene oleyl ether, polyoxyethylene higher alcohol ether, polyoxyethylene octyl phenyl ether, polyoxyethylene nonyl phenyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hardened castor oil, alkylalkanolamide and mixtures thereof; the water-soluble cationic dispersing agent is selected from the group consisting of polyvinylpyrrolidone, coconutamine acetate, stearylamine acetate and mixtures thereof; the water-soluble ampholytic dispersing agent is selected from the group consisting of laurylbetaine, stearylbetaine, lauryldimethylamine oxide, 2-alkyl-N-carboxymethyl-N-hydroxyethylimidazolinium betaine, and mixtures thereof.

11. The method of claim 2, wherein the solution consisting of:

from 0.001 wt % to 30 wt % of at least one acid selected from the group consisting of citric acid and oxalic acid;
from 0.001 wt % to 20 wt % of the base and from 0.001 wt % to 10 wt % of the surfactant;
the remainder being substantially deionized water;
the solution is diluted with deionized water from 1:0 to 1:10000;
wherein
the base is potassium hydroxide (KOH); and
the surfactant is selected from the group consisting of secondary alcohol ethoxylate secondary alkanesulfonate, and mixtures thereof.

* * * * *